(12) United States Patent
Park (10) Patent No.: US 7,877,723 B2
(45) Date of Patent: Jan. 25, 2011

(54) METHOD OF ARRANGING MASK PATTERNS AND APPARATUS USING THE METHOD

(75) Inventor: Dong-Woon Park, Seoul (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 459 days.

(21) Appl. No.: 11/936,610

(22) Filed: Nov. 7, 2007

(65) Prior Publication Data

US 2008/0138719 A1  Jun. 12, 2008

(30) Foreign Application Priority Data

Dec. 12, 2006  (KR)  ............... 10-2006-0126378

(51) Int. Cl.
G06F 17/50  (2006.01)
(52) U.S. Cl. .................... 716/50; 716/51; 716/52; 716/53; 716/54; 716/55
(58) Field of Classification Search ............ 716/19–21, 716/50–55; 430/5, 22, 30
See application file for complete search history.

(56) References Cited

U.S. PATENT DOCUMENTS

| | | | |
|---|---|---|---|
| 7,487,489 B2 | 2/2009 | Granik | |
| 7,721,346 B2 | 5/2010 | Li et al. | |
| 2005/0142470 A1* | 6/2005 | Socha et al. | 430/30 |
| 2006/0075377 A1* | 4/2006 | Broeke et al. | 716/19 |
| 2006/0147815 A1 | 7/2006 | Melvin, III et al. | |
| 2006/0188673 A1 | 8/2006 | Melvin, III et al. | |
| 2006/0236296 A1* | 10/2006 | Melvin et al. | 716/20 |
| 2008/0301620 A1* | 12/2008 | Ye et al. | 716/19 |

FOREIGN PATENT DOCUMENTS

KR  2005-0041958  5/2005

(Continued)

OTHER PUBLICATIONS

English language abstract of Korean Publication No. 2005-0041958.
English language abstract of Korean Publication No. 2006-0050603.
Li, et al., Rapid search of the Optimum placement of assist feature to improve the aerial image gradient in iso-line structure, 2007, SPIE, pp. 1-7.

*Primary Examiner*—Paul Dinh
(74) *Attorney, Agent, or Firm*—Muir Patent Consulting, PLLC (57) ABSTRACT

Provided are a method of fabricating a semiconductor and an apparatus using the method, and more particularly, a method of effectively arranging assist features on the mask and an apparatus using the method. The method of arranging mask patterns includes separately calculating contributions of an assist feature to image intensity at an optimal focus and at a defocus position and placing the assist feature at a position where the contribution of the assist feature to the image intensity is greater at the defocus position than at the optimal focus position. The method includes a first operation of obtaining a first contribution function for contribution of an assist feature to image intensity at a main feature at a first focus position; a second operation of obtaining a second contribution function for contribution of the assist feature to the image intensity at the main feature at a second focus position; and a third operation of determining the position of the assist feature to be a position satisfying a condition that a linear combination of the first contribution function and the second contribution function exceeds a predetermined threshold value.

30 Claims, 7 Drawing Sheets

FOREIGN PATENT DOCUMENTS

| KR | 20050069518 | 7/2005 |
| KR | 2006-0050603 | 5/2006 |

\* cited by examiner

METHOD OF ARRANGING MASK PATTERNS AND APPARATUS USING THE METHOD

This application claims the priority of Korean Patent Application No. 10-2006-0126378, filed on Dec. 12, 2006, in the Korean Intellectual Property Office, the disclosure of which is incorporated herein in its entirety by reference.

BACKGROUND OF THE INVENTION

1. Field of the Invention

The present invention relates to a method of fabricating a semiconductor and an apparatus using the method, and more particularly, to a method of arranging mask patterns and an apparatus using the method.

2. Description of the Related Art

One of the goals in integrated circuit fabrication is to faithfully reproduce the original circuit design on a semiconductor wafer by using as much area of the semiconductor wafer as possible. Another goal is to optimize exposure and improve image intensity on the semiconductor wafer. Yet another goal is to increase the depth of focus (DOF) and exposure latitude (EL). However, the microscopic size of main features makes it difficult for light to pass through holes or lines in the photomask used to transfer such features to the wafer. Consequently, the DOF and the EL are reduced.

Conventional methods suggested in order to solve this problem include a method of placing assist features in a mask such that light intensity on a feature to be generated can be increased (which, in turn, will increase DOF and EL). It is known that proper use of assist features generally results in improvements in processing performance. However, no methodology on how to specifically place assist features in order to obtain optimal processing performance, and in a particular processing performance such as EL, DOF, or a mask error enhancement factor (MEEF), has been established. In particular, DOF performance is maximized when the difference in imaging performance at two or more focal positions is minimized. Therefore, optimization of the DOF performance requires more complex calculation than that of EL or MEEF which is performed under a single processing condition. Recently, exposure equipment having a very high numerical aperture (NA) value is being increasingly used in lithography processes. This has resulted in a sharp reduction in DOF performance. Therefore, the enhancement of processing performance, particularly the DOF performance, is much desired.

Conventional method places assist features based on an imaging result at a defocus position, thereby enhancing imaging performance at the defocus position and thus securing a wider DOF. However, since this method completely ignores information regarding an optimal focus position, DOF optimization cannot be guaranteed. This is because DOF performance is maximized when the difference between imaging performance at the optimal focus position and imaging performance at the defocus position is minimized.

Therefore, a new method of effectively determining optimal positions of assist features is required in order to obtain maximum DOF performance.

SUMMARY OF THE INVENTION

Provided are a method of effectively arranging assist features on a photomask in order to improve the depth of focus (DOF), a recording medium having recorded thereon a program for determining optimal positions of assist features in a mask, and a mask that includes assist features located at optimal positions determined according to the invention.

The method of arranging mask patterns includes separately calculating contributions of an assist feature to image intensity at an optimal focus and at a defocus position and placing the assist feature at a position where the contribution of the assist feature to the image intensity is greater at the defocus position than at the optimal focus position. The method further includes a first operation of obtaining a first contribution function for contribution of an assist feature to image intensity at a main feature at a first focus position; a second operation of obtaining a second contribution function for contribution of the assist feature to the image intensity at the main feature at a second focus position; and a third operation of determining the position of the assist feature to be a position satisfying a condition that a linear combination of the first contribution function and the second contribution function exceeds a predetermined threshold value.

The first contribution function and the second contribution function may be functions $h(\xi-x)$ determined by:

$$\frac{I(x) - I_0(x)}{2\sqrt{I_0(x)}} = h(\xi-x)m(\xi)\Delta\xi,$$

where x indicates a point on the main feature, $\xi$ indicates a point on the assist feature, $I(x)$ indicates image intensity at the main feature when the assist feature is present, $I_0(x)$ indicates image intensity at the main feature when the assist feature is not present, and $m(\xi)$ indicates transmittance of a mask.

The first and second operations may include obtaining the functions $h(\xi-x)$ respectively for all points on the main feature on the entire domain of the mask.

In the third operation, the determined position of the assist feature may satisfy a condition in which a value obtained by multiplying the first contribution function by a constant c and subtracting the result of multiplication from the second contribution function exceeds the predetermined threshold value T on the entire domain of the mask, that is:

$$h_2(\xi-x) - c \cdot h_1(\xi-x) \geq T,$$

where $h_1(\xi-x)$ is the first contribution function and $h_2(\xi-x)$ is the second contribution function.

The second focus position may be more defocused than the first focus position. The first focus position may be an optimal focus position.

The value of the constant c may be one. The predetermined threshold value T may be zero.

The method may further include a fourth operation of reducing the size of the assist feature after the third operation if a side lobe phenomenon in which the assist feature is printed on a semiconductor wafer occurs.

The method may further include a fifth operation of applying optical proximity correction (OPC) to the main feature after the third operation in order to implement a predetermined critical dimension.

The method may further include a sixth operation of using a mask rule check after the third operation in order to enhance the performance of the mask.

According to another aspect of the present invention, there is provided a recording medium on which a program for arranging mask patterns is recorded, the program including a first operation of obtaining a first contribution function for contribution of an assist feature to image intensity at a main feature at a first focus position; a second operation of obtaining a second contribution function for contribution of the assist feature to the image intensity at the main feature at a second focus position; and a third operation of determining the position of the assist feature to be a position satisfying a condition that a linear combination of the first contribution function and the second contribution function exceeds a predetermined threshold value.

According to another aspect of the present invention, there is provided a mask including a main feature; and an assist feature, wherein the position of the assist feature is determined to be a position satisfying a condition that a linear combination of a first contribution function for contribution of the assist feature to image intensity at the main feature at a first focus position and a second contribution function for contribution of the assist feature to the image intensity at the main feature at a second focus position exceeds a predetermined threshold value.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth therein; rather, these embodiments are provided so that this disclosure will be thorough and complete, and will fully convey the concept of the invention to those skilled in the art. In the drawings, the thickness of layers and regions are exaggerated for clarity. Like reference numerals in the drawings denote like elements, and thus their description will not be repeated. It will also be understood that when an element, such as a layer, a region or a substrate, is referred to as being "on" another element, it can be directly on the other element, or intervening elements may also be present.

Spatially relative terms, such as "lower," "bottom," "upper," "top," and the like, may be used herein for ease of description to describe one element's relationship to another element(s) as illustrated in the drawings. It will be understood that the spatially relative terms are intended to encompass different orientations of a device in use or operation in addition to the orientation depicted in the drawings. For example, if a device in the figures is turned over, elements described as being on "lower" surfaces of other elements would then be oriented to be on "upper" surfaces of the other elements. Thus, the exemplary term "lower" can encompass both an orientation of upper and lower. Similarly, if a device in the figures is turned over, elements described as "below or beneath" other elements would then be oriented "above" the other elements. Thus, the exemplary term "below or beneath" can encompass both an orientation of above and below.

Hereinafter, a method of determining positions of assist features in a mask, that is, a method of arranging mask patterns, according to the present invention will be described.

First of all, a method of obtaining a function h, which is a contribution function, will be described. The contribution function represents the contribution of an assist feature to image intensity at a main feature. Image intensity I(x) generated on a semiconductor wafer at a main feature on a mask may be approximated to Equation (1).

$$I(x) \cong e^2(x) = \left(e_0(x) + \sum_{\xi} \Delta e(x, \xi)\right)^2, \quad (1)$$

where x indicates a point on a main feature, and ξ indicates a point on an assist feature. In addition, $e_0(x)$ indicates the contribution of the main feature to the image intensity I(x), and:

$$\sum_{\xi} \Delta e(x, \xi)$$

indicates the contribution of the assist feature to the image intensity I(x). An increase or decrease in the contribution of the assist feature leads to an increase or decrease in the image intensity I(x).

If m(ξ) is defined as transmittance of the mask, the contribution of the assist feature may be given by Equation (2).

$$\Delta e(x,\xi)=h(\xi-x)m(\xi)\Delta\xi \quad (2)$$

In addition, if image intensity at the main feature when the assist feature is not present is $I_0(x)$, Equation (1) may be rearranged into Equations (3) through (5).

$$I_0=e_0^2 \quad (3).$$

$$I=I_0+\Delta I \quad (4).$$

$$\Delta I \cong 2e\Delta e \quad (5).$$

Equation (6) may also be obtained from Equations (3) through (5).

$$\Delta e = \frac{I - I_0}{2e} \cong \frac{I - I_0}{2e_0} = \frac{I - I_0}{2\sqrt{I_0}}. \quad (6)$$

That is, the contribution of the assist feature can be represented by its relationship with image intensity. The relationship between the contribution function (e.g., a function h) and image intensity is defined by Equation (7).

$$\frac{I(x) - I_0(x)}{2\sqrt{I_0(x)}} = h(\xi - x)m(\xi)\Delta\xi. \quad (7)$$

Figure 2:
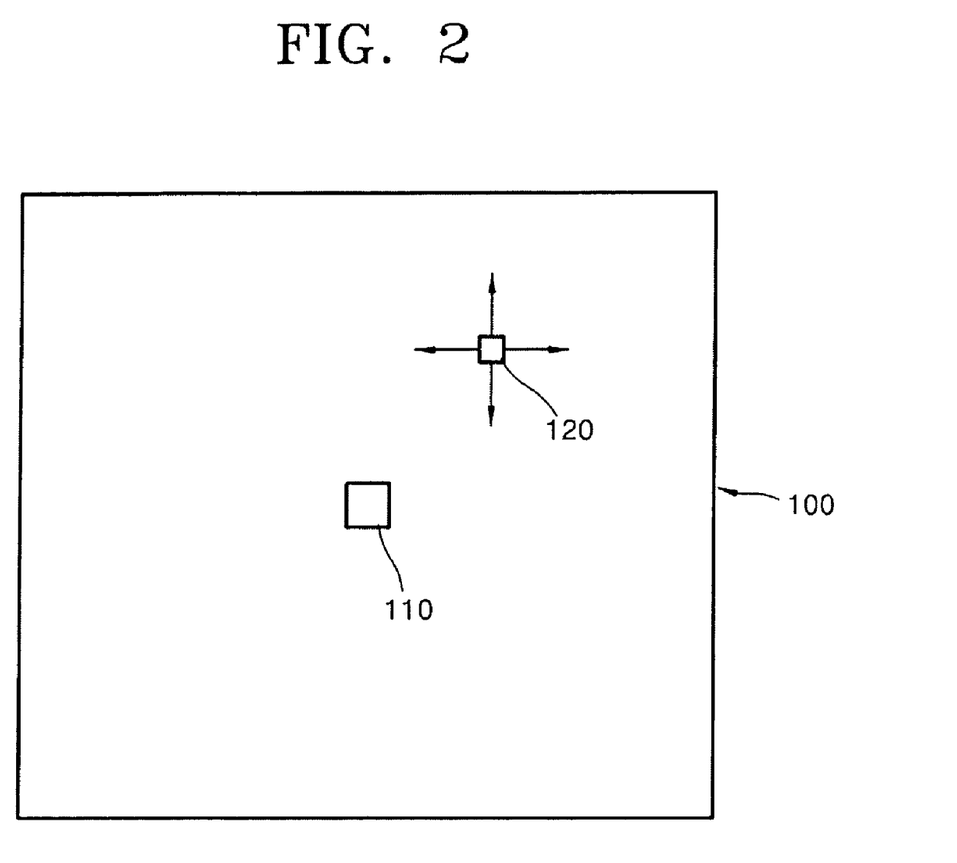
FIG. 2 is a plan view of a mask including a main feature and an assist feature for explaining a process of inducing a function h.

FIG. 2 is a plan view of a mask 100 including a main feature 110 and an assist feature 120 for explaining a process of inducing a function h.

Referring to FIG. 2, a function $h(\xi-x)$ may be represented by image intensity at the main feature 110 and the mask transmittance of the assist feature 120 according to Equation (7). The function $h(\xi-x)$ is calculated while fixing the main feature 110 formed of a small, isolated portion onto the mask 100 and sweeping the assist feature 120 formed of a small portion over the entire domain of the mask 100 as indicated by arrows in FIG. 2. A goal here is to calculate a function h of $\xi-x$, i.e., the relative displacement between the main feature 110 and the assist feature 120.

According to Equation (2), the function h is dependent on $\xi-x$, i.e., the relative positions of the main feature 110 and the assist feature 120, but is not directly dependent on the position of the main feature 110. Therefore, once the function h is calculated as described above and stored in the form of a table, even when there are a plurality of main features, values of functions h can be easily and quickly obtained using a look-up table method by applying the relative positions $\xi-x$ of an assist feature to be reviewed and main features to the table of the functions h calculated in advance.

Figure 3:
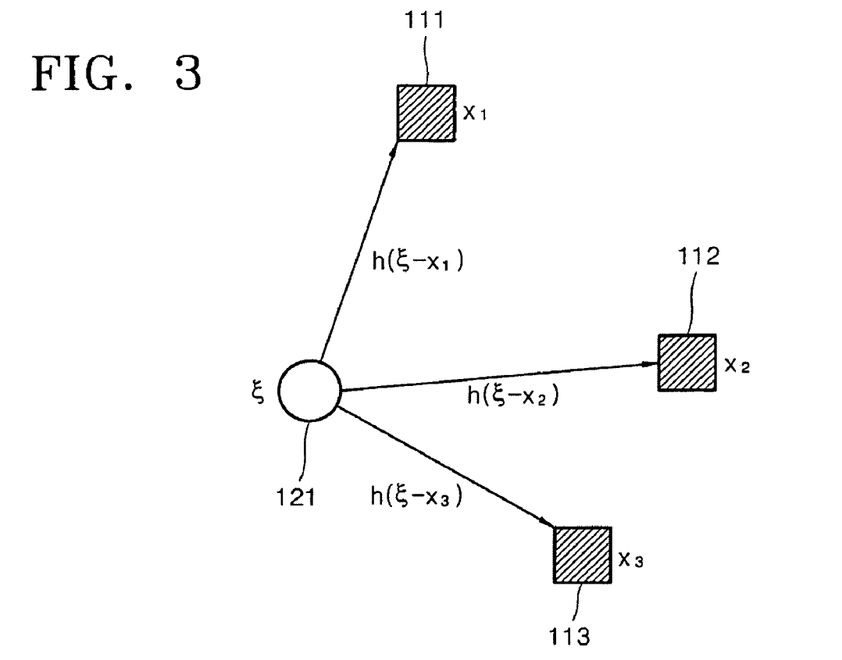
FIG. 3 is a conceptual diagram illustrating a method of calculating functions h of an assist feature respectively for all points on main features.

Next, the functions h are calculated respectively for all points on main features. FIG. 3 is a conceptual diagram illustrating a method of calculating the functions h of an assist feature 121 respectively for all points on main features. Referring to FIG. 3, after the assist feature 121 is fixed, a function $h(\xi-x)$ is calculated for each position on the main features. That is, a function $h(\xi-x_1)$ for a position $x_1$ of a first main feature 111 can be obtaineddirectly from a table of functions h calculated in advance. In addition, a function $h(\xi-x_2)$ for a position $x_2$ of a second main feature 112 can be obtained directly from the table of functions h calculated in advance. Also, a function $h(\xi-x_3)$ for a position $x_3$ of a third main feature 113 can be obtained directly from the table of functions h calculated in advance. In this way, the functions h for the positions of all main features on a mask can be quickly calculated.

Using the method described above, functions h, which are contribution functions representing the contribution of assist features to image intensity at main features, have been calculated.

A method of arranging mask patterns using the contribution functions in order to improve the depth of focus (DOF) will now be described. DOF increases as the difference between image intensity at an optimal focus and image intensity at a defocus position (out of the optimal focus position) is reduced. Generally, image intensity by only a main feature is greater at the optimal focus than at the defocus position. Therefore, the contribution of an assist feature to the image intensity may have a greater value at the defocus position than at the optimal focus position.

A method of determining the optimal position of an assist feature in a mask according to the present invention includes an operation of separately calculating contributions (e.g., the functions h) of an assist feature to image intensity at an optimal focus and at a defocus position and placing the assist feature at a position where the contribution of the assist feature to the image intensity is greater at the defocus position than at the optimal focus position.

Figure 1A:
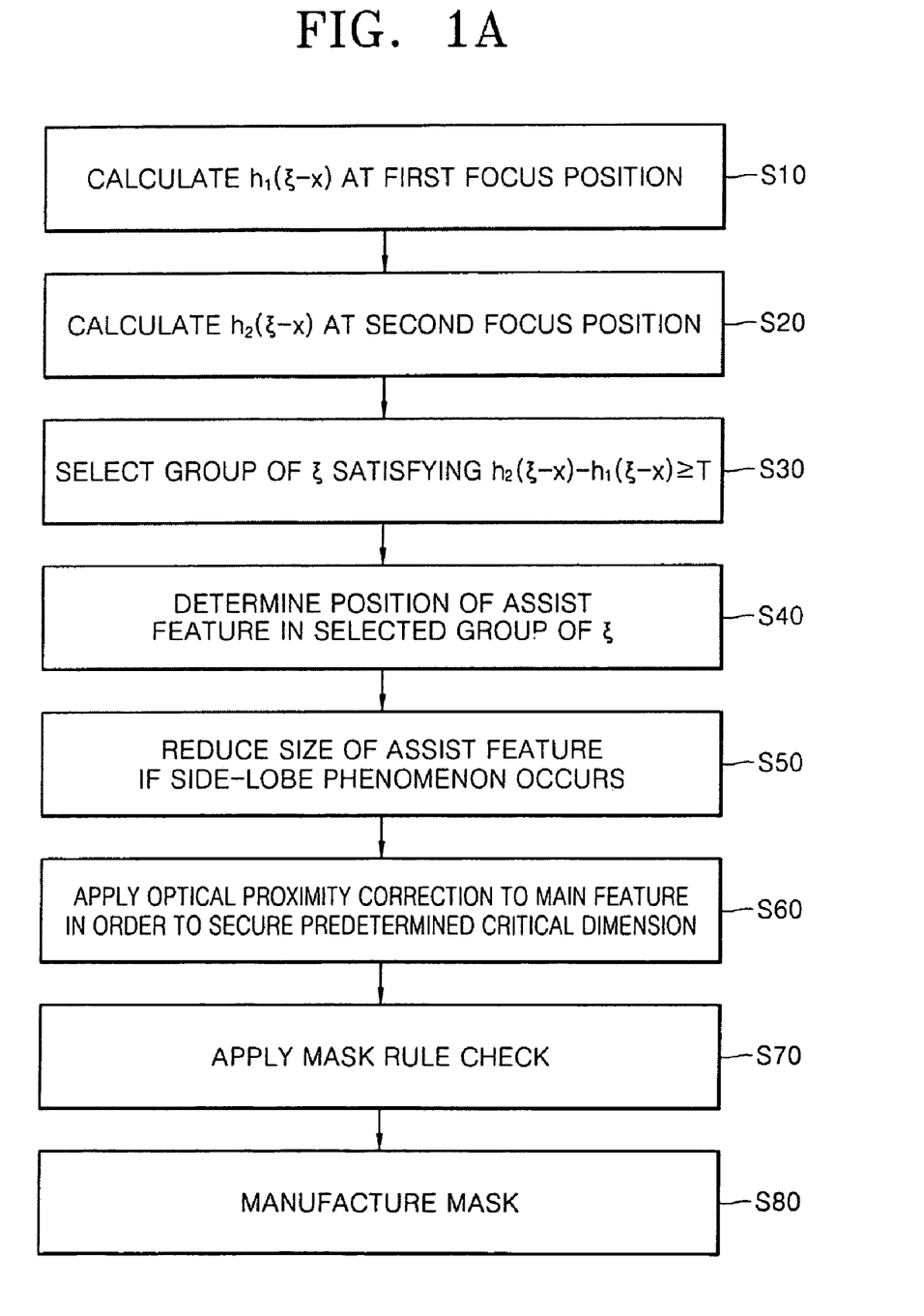
FIGS. 1A and 1B are flowcharts illustrating a method of arranging mask patterns according to embodiments of the present invention.
Figure 1B:
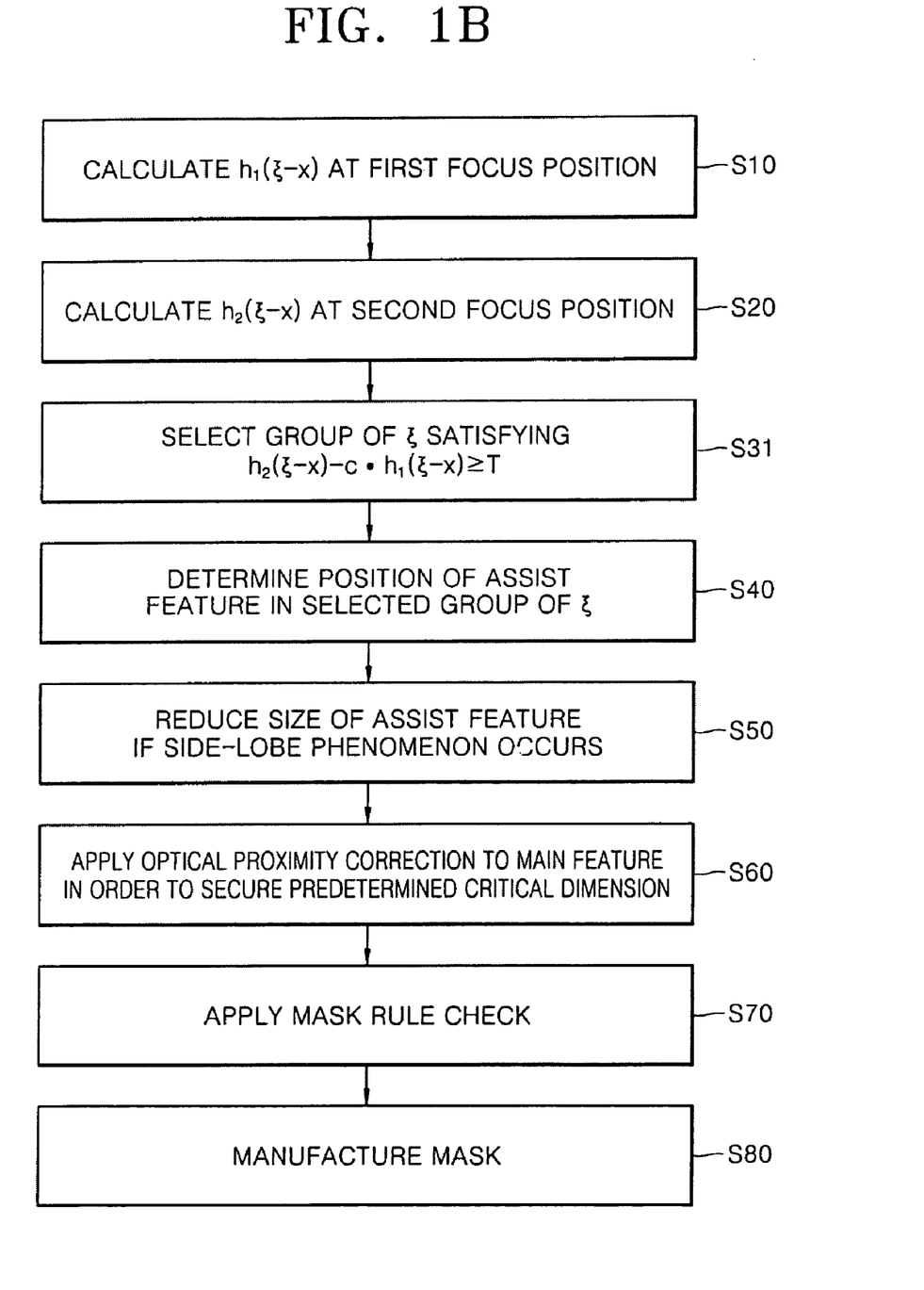

FIGS. 1A and 1B are flowcharts illustrating a method of arranging mask patterns according to embodiments of the present invention.

Referring to FIGS. 1A and 1B, at a first focus position, a first contribution function for the contribution of an assist feature to image intensity at a main feature is calculated (operation S10). At a second focus position, a second contribution function for the contribution of the assist feature to image intensity at the main feature is calculated (operation S20). Here, the second focus position may be more defocused than the first focus position. The first focus position may be an optimal focus position. In addition, the first contribution function and the second contribution function may be functions $h(\xi-x)$ determined by Equation (7). As described above with reference to FIG. 3, the functions $h(\xi-x)$, such as the first and second contribution functions, may be calculated respectively for all points on the main features on the entire domain of a mask.

Next, a group of positions of assist features $\xi$, which satisfies a condition that a linear combination of the first and second contribution functions exceeds a predetermined threshold value T, is selected (operations S30 and 31). According to an embodiment of the present invention, the linear combination may be the difference between the first and second contribution functions (operation S30). According to another embodiment of the present invention, the linear combination may be the difference between the second contribution function and the result of multiplying the first contribution function by a constant c. This relationship may be defined by Equation (8).

$$h_2(\xi-x) - c \cdot h_1(\xi-x) \geq T, \quad (8)$$

where $h_1(\xi-x)$ indicates the first contribution function, and $h_2(\xi-x)$ indicates the second contribution function. The constant c can be used to adjust a ratio of the first contribution function to the second contribution function. In addition, the constant c can be used to balance DOF with another processing performance (exposure latitude (EL) or a mask error enhancement factor (MEEF)). That is, the constant c is a weighting factor that can take into consideration other processing variables. A predetermined threshold value T may be set to zero so that the assist feature can contribute to image intensity I(x) as a positive value. That is, the predetermined threshold value T may be set to a value which causes the difference between the first and second contribution functions to have a positive value.

The position of the assist feature may be determined in the selected group of $\xi$ which satisfies the condition that the linear combination of the first and second contribution functions exceeds the predetermined threshold value (operation S40). In other words, the position of the assist feature may be determined in the selected group of $\xi$ or may be determined by including part of the selected group of $\xi$.

After the position of the assist feature is determined (operation S40), a side lobe phenomenon in which the assist feature is printed on a semiconductor wafer may occur. That is, although the assist feature is a pattern formed on the mask in order to accurately reproduce the main feature on the semiconductor wafer, it may be printed on the semiconductor wafer, which is dependent on the size of assist feature. In this case, the size of the assist feature must be reduced in order to prevent the printing of the assist feature on the semiconductor wafer (operation S50).

After the position of the assist feature is determined (operation S40), optical proximity correction (OPC) is applied to the main feature in order to implement a predetermined critical dimension on the semiconductor wafer (operation S60).

In addition, after the position of the assist feature is determined (operation S40), a mask rule check (MRC) is used in order to improve mask performance, that is, in order to accurately reproduce patterns implemented on the semiconductor wafer (operation S70).

The above operations S50 through S70 are performed after the position of the assist feature is determined (operation S40). In modified embodiments of the present invention, the operations S50 through S70 illustrated in FIGS. 1A and 1B may be performed in different orders, and some of the operations S50 through S70 may be omitted.

A design of mask patterns arranged after the operations S10 through S70 are performed is implemented as patterns on the mask in a subsequent manufacturing process (operation S80).

Figure 4A:
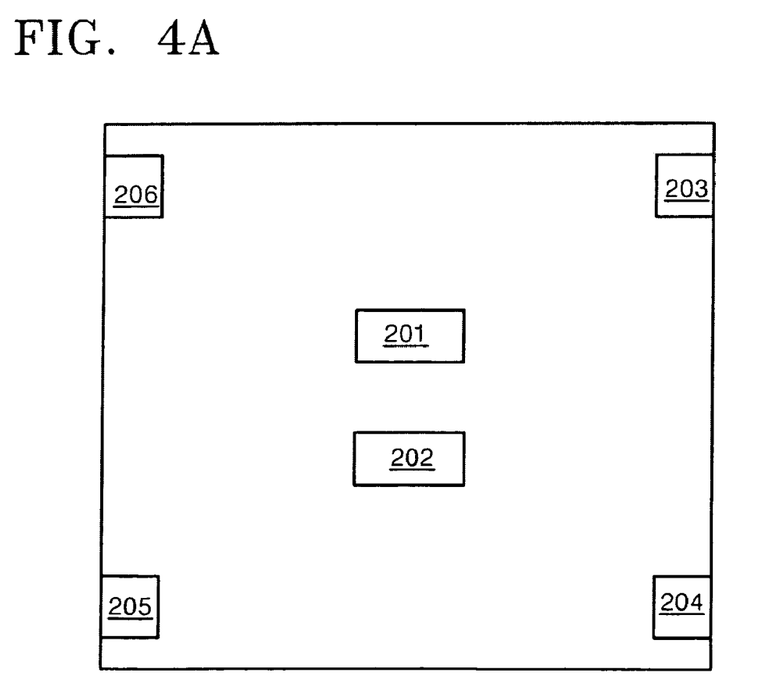
FIG. 4A is a plan view illustrating the arrangement of main features on a mask.
Figure 4B:
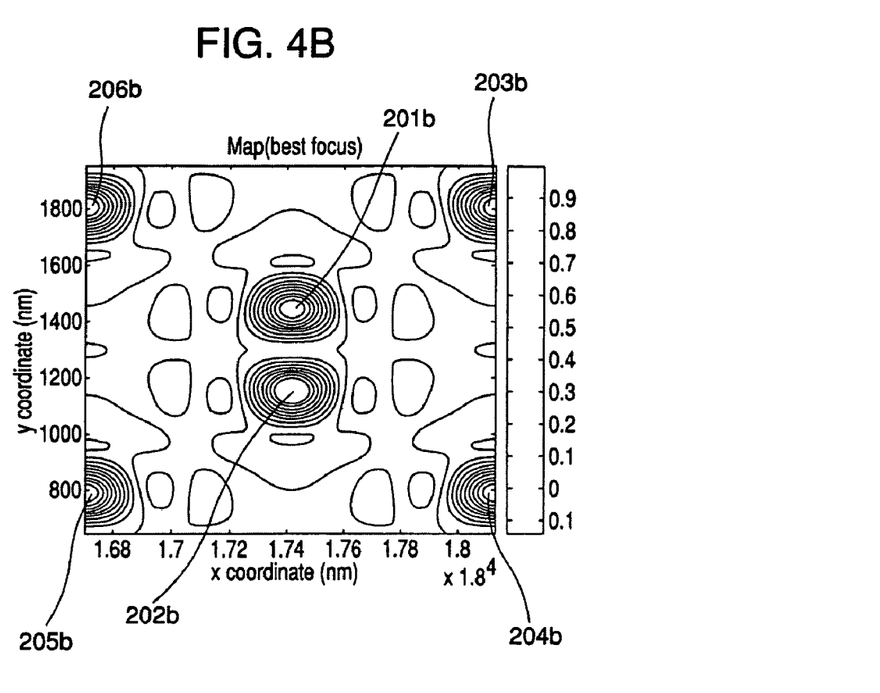
FIG. 4B illustrates a simulation result of the amplitude of an image projected onto a semiconductor wafer at an optimal focus position.
Figure 4C:
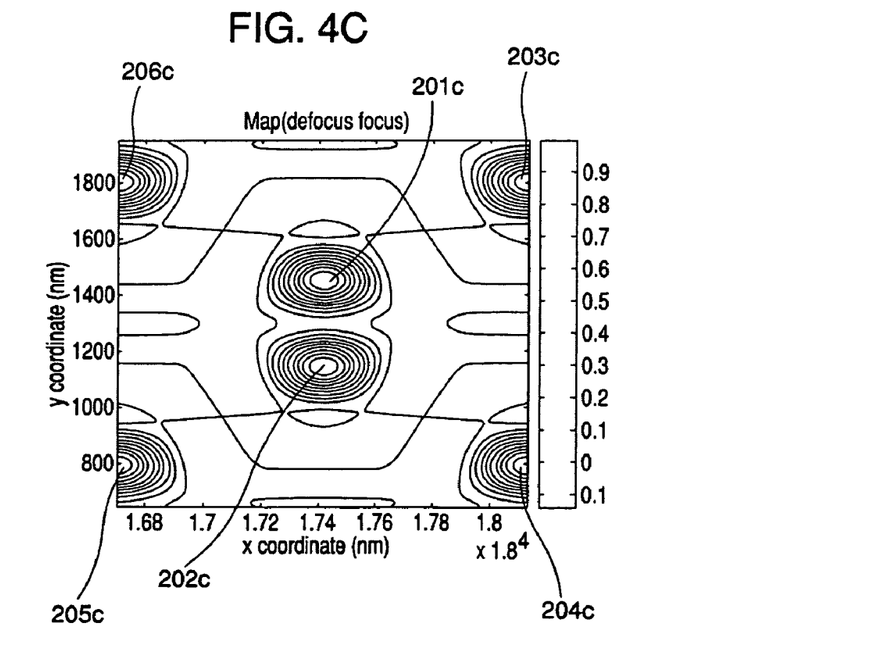
FIG. 4C illustrates the simulation result of the amplitude of the image projected onto the semiconductor wafer at a defocus position of 0.2 μm.
Figure 4D:
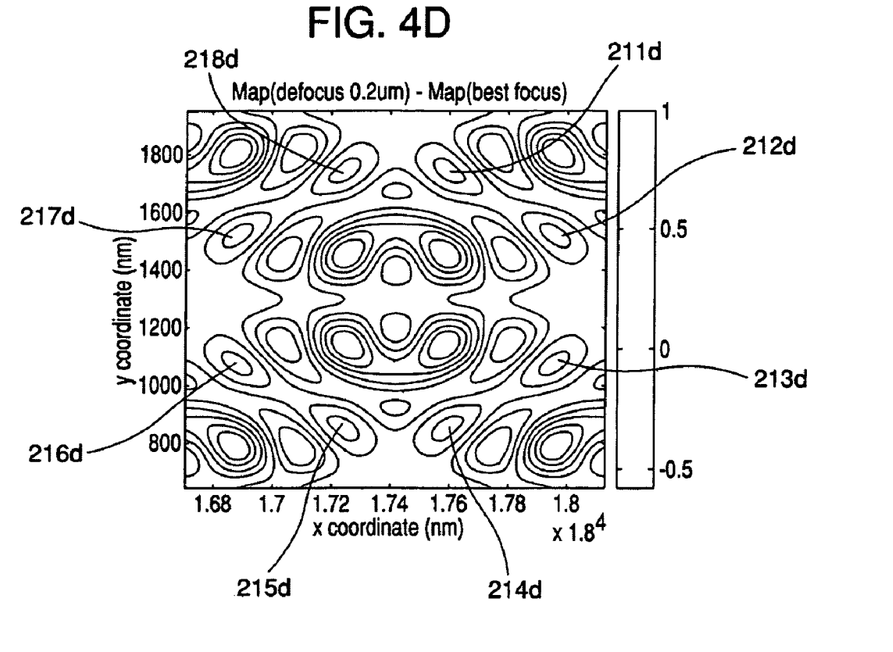
FIG. 4D illustrates the simulation result of the difference between the simulation result illustrated in FIG. 4C and the simulation result illustrated in FIG. 4B.
Figure 4E:
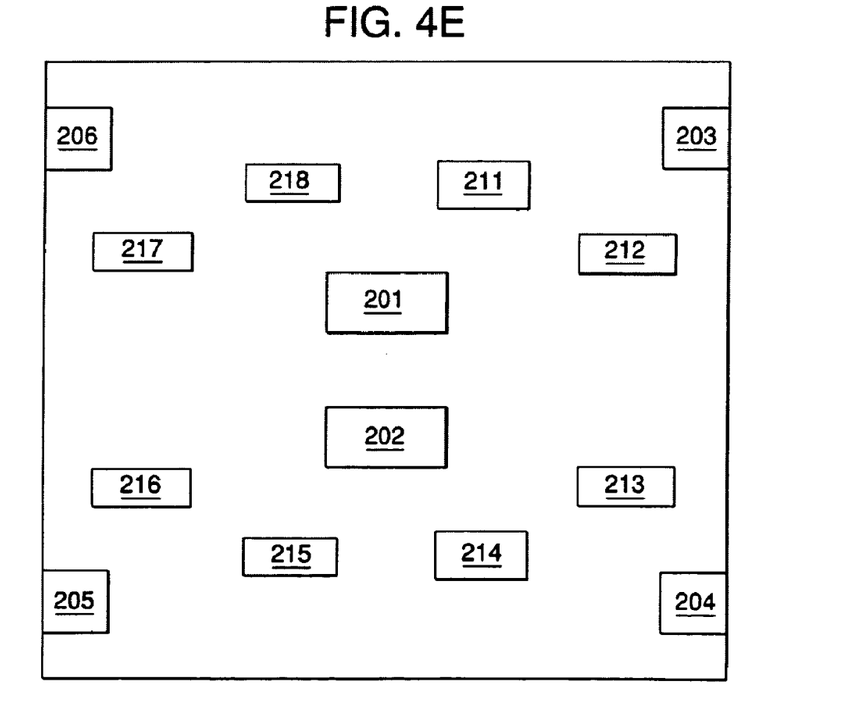
FIG. 4E is a plan view illustrating assist features arranged on a mask according to an embodiment of the present invention.

FIG. 4A is a plan view illustrating the arrangement of main features on a mask. FIGS. 4B through 4D illustrate simulation results of the amplitude of an image projected onto a semiconductor wafer according to embodiments of the present invention. FIG. 4E is a plan view illustrating assist features arranged on a mask according to an embodiment of the present invention.

Referring to FIG. 4A, two main features 201 and 202 are arranged at the center of the mask, and four main features 203 through 206 are arranged at the edges of the mask.

FIG. 4B illustrates the simulation result of the amplitude of the image projected onto the semiconductor wafer at an optimal focus position. Referring to FIG. 4B, regions 201$b$ through 206$b$ (corresponding to the positions of the main features 201 through 206 illustrated in FIG. 4A) are represented with a greater density of contour lines, but would typically be shown within a computer simulation display as having a brighter color than their surroundings where color represents greater amplitude of the image projected onto the semiconductor wafer.

FIG. 4C illustrates the simulation result of the amplitude of the image projected onto the semiconductor wafer at a defocus position of 0.2 μm. Referring to FIG. 4C, regions 201$c$ through 206$c$ (corresponding to the positions of the main features 201 through 206 illustrated in FIG. 4A) are represented with a greater density of contour lines, but would typically be shown within a computer simulation display as having a brighter color than their surroundings where color represents greater amplitude of the image projected onto the semiconductor wafer.

FIG. 4D illustrates the simulation result of the difference between the simulation result illustrated in FIG. 4C and the simulation result illustrated in FIG. 4B. Referring to FIG. 4D, a first region, typically shown within a computer simulation display in yellow (e.g. regions 211$d$ through 218$d$), is formed around the main features 201 and 202 at the center of the mask. If assist features are formed in the first region 211$d$ through 218$d$, enhancement of the DOF can be expected.

Referring to FIG. 4E, assist features 211 through 218 are placed in the first region illustrated in FIG. 4D.

Figure 5A:
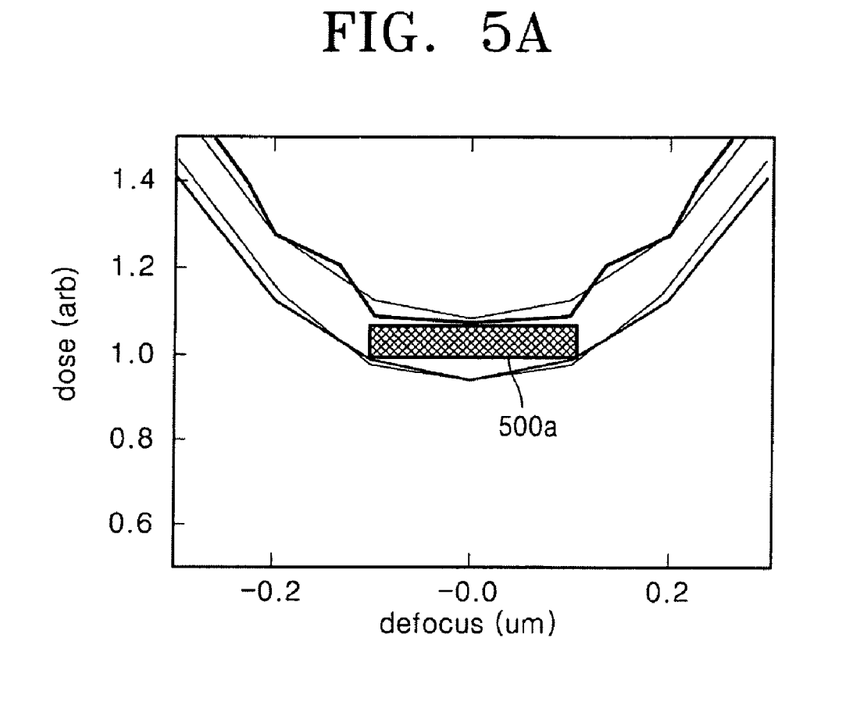
FIG. 5A is a graph illustrating a process window for mask patterns illustrated in FIG. 4A.
Figure 5B:
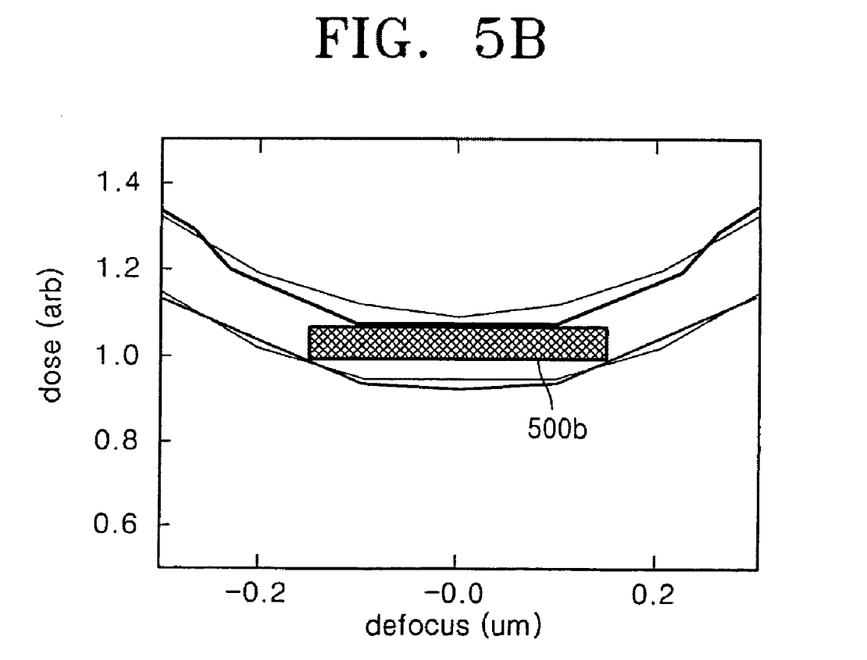
FIG. 5B is a graph illustrating a process window for mask patterns illustrated in FIG. 4E.

FIGS. 5A and 5B are graphs illustrating process windows for mask patterns illustrated in FIGS. 4A and 4E, respectively.

Referring to FIG. 5A, a square process window 500$a$ can be obtained from a process window of the mask on which the main features 201 through 206 are arranged as illustrated in FIG. 4A. The height of the process window 500$a$ denotes EL performance (6.8%), and the width of the process window 500$a$ denotes DOF performance (0.21 μm).

Referring to FIG. 5B, a square process window 500$b$ can be obtained from a process window of the mask on which the main features 201 through 206 and the assist features 211 through 218 are arranged as illustrated in FIG. 4E. The height of the process window 500$b$ denotes EL performance (6.8%), and the width of the process window 500$b$ denotes DOF performance (0.30 μm). That is, as a result of applying the method of arranging mask patterns according to the present invention, the DOF performance improves approximately 43% while the EL performance remained unchanged.

The invention further comprises a recording medium on which a program for determining the optimal positions of assist features in a mask is recorded.

Software functionalities of a computer system involve programming, including executable code, may be used to implement the above described method of determining an optimal position of an assist feature of a mask. Since the method has been described, a detailed description thereof will be omitted here. The software code is executable by the general-purpose computer. In operation, the code and possibly the associated data records are stored within a general-purpose computer platform. At other times, however, the software may be stored at other locations and/or transported for loading into the appropriate general-purpose computer systems. Hence, the embodiments discussed above involve one or more software products in the form of one or more modules of code carried by at least one machine-readable medium. Execution of such code by a processor of the computer system enables the platform to implement the catalog and/or software downloading functions, in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as one of the server platform, discussed above. Volatile media include dynamic memory, such as main memory of such a computer platform. Physical transmission media include coaxial cables; copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

Next, a mask including an assist feature placed at an optimal position will now be described.

The mask includes main and assist features. The position of the assist feature is determined at a position satisfying the condition that a linear combination of a first contribution function and a second contribution function exceeds a predetermined threshold value. The first contribution function models the contribution of the assist feature to image intensity at the main feature at a first focus position. The second contribution function models the contribution of the assist feature to image intensity at the main feature at a second focus position.

The first contribution function and the second contribution function may be functions $h(\xi-x)$ determined by Equation (7). In addition, the functions $h(\xi-x)$ may be calculated respectively for all points on the main feature on the entire domain of the mask. The second focus position may be more defocused than the first focus position. In particular, the first focus position may be an optimal focus position. Since the linear combination of the first and second contribution functions has been described above with reference to Equation (11), a detailed description thereof will be omitted here. The optical proximity correction (OPC) is preferably applied to the main feature in order to implement a predetermined critical dimension.

According to a method of arranging mask patterns and an apparatus using the method, the positions of assist features that can enhance DOF performance can be properly and quickly determined, thereby contributing to stable production of semiconductors and enhancement of yield.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of arranging mask patterns, the method comprising:
    separately calculating contributions of an assist feature to image intensity at a main feature at a first focus position and at a second focus position by using a computer;
    placing the assist feature at the second locus position when the contribution of the assist feature to the image intensity at the main feature is greater at the second focus position than at the first focus position;
    obtaining a first contribution function in a first operation for determining the contribution at the first focus position of an assist feature to image intensity at a main feature;
    obtaining a second contribution function in a second operation for determining the contribution at the second focus position of the assist feature to the image intensity at the main feature;
    determining a position of the assist feature in a third operation that satisfies a condition in which a linear combination of the first contribution function and the second contribution function exceeds a predetermined threshold value; and
    arranging the assist feature within the mask patterns at the position satisfying the condition.

2. The method of claim 1, wherein the first focus position is an optimal focus position and the second focus position is a defocus position.

3. A method of arranging mask patterns, the method comprising:
    separately calculating contributions of an assist feature to image intensity at a main feature at a first focus position and at a second focus position by using a computer;
    placing the assist feature at the second focus position where when the contribution of the assist feature to the image intensity at the main feature is greater at the second focus position than at the first focus position;
    obtaining a first contribution function in a first operation for determining the contribution at the first focus position of an assist feature to image intensity at a main feature;
    obtaining a second contribution function in a second operation for determining the contribution at the second focus position of the assist feature to the image intensity at the main feature;
    determining a position of the assist feature in a third operation that satisfies a condition in which a linear combination of the first contribution function and the second contribution function exceeds a predetermined threshold value; and
    arranging the assist feature within the mask patterns at the position satisfying the condition,
    wherein the first contribution function and the second contribution function are functions $h(\xi-x)$ determined by:

$$\frac{I(x) - I_0(x)}{2\sqrt{I_0(x)}} = h(\xi-x)m(\xi)\Delta\xi,$$

where x indicates a point on the main feature, $\xi$ indicates a point on the assist feature, $I(x)$ indicates image intensity at the main feature when the assist feature is present, $I_0(x)$ indicates image intensity at the main feature when the assist feature is not present, and $m(\xi)$ indicates transmittance of a mask.

4. The method of claim 3, wherein the first and second operations comprise obtaining the functions $h(\xi-x)$ respectively for all points on the main feature on the entire domain of the mask.

5. The method of claim 4, wherein, in the third operation, the determined position of the assist feature satisfies a condition in which a value obtained by multiplying the first contribution function by a constant c and subtracting the result of multiplication from the second contribution function exceeds the predetermined threshold value T on the entire domain of the mask according to the equation:

$$h_2(\xi-x) - c \cdot h_1(\xi-x) \geq T,$$

where $h_1(\xi-x)$ is the first contribution function and $h_2(\xi-x)$ is the second contribution function.

6. The method of claim 5, wherein the second focus position is more defocused than the first focus position.

7. The method of claim 6, wherein the first focus position is an optimal focus position.

8. The method of claim 7, wherein a value of the constant c is one.

9. The method of claim 7, wherein the predetermined threshold value T is zero.

10. The method of claim 3, further comprising reducing the size of the assist feature in a fourth operation after the third operation if a side lobe phenomenon occurs in which the assist feature is printed on a semiconductor wafer.

11. The method of claim 3, further comprising applying optical proximity correction (OPC) in a fifth operation to the main feature after the third operation in order to implement a predetermined critical dimension.

12. The method of claim 3, further comprising using a mask rule check in a sixth operation after the third operation in order to enhance the performance of the mask.

13. A computer readable storage device storing a computer readable program to be executed by a computer for arranging mask patterns, the program comprising:
   a first operation programmed to obtain a first contribution function for contribution of an assist feature to image intensity at a main feature at a first focus position;
   a second operation programmed to obtain a second contribution function for contribution of the assist feature to the image intensity at the main feature at a second focus position; and
   a third operation programmed to determine a position of the assist feature as satisfying a condition in which a linear combination of the first contribution function and the second contribution function exceeds a predetermined threshold value,
   wherein the first contribution function and the second contribution function are functions h(ξ−x) determined by:

$$\frac{I(x) - I_0(x)}{2\sqrt{I_0(x)}} = h(\xi - x)m(\xi)\Delta\xi,$$

where x indicates a point on the main feature, ξ indicates a point on the assist feature, I(x) indicates image intensity at the main feature when the assist feature is present, $I_0(x)$ indicates image intensity at the main feature when the assist feature is not present, and m(ξ) indicates transmittance of a mask.

14. The storage device of claim 13, wherein the first and second operations comprise obtaining the functions h(ξ−x) respectively for all points on the main feature on the entire domain of the mask.

15. The storage device of claim 14, wherein the second focus position is more defocused than the first focus position.

16. The storage device of claim 15, wherein the first focus position is an optimal focus position.

17. The storage device of claim 16, wherein, in the third operation, the determined position of the assist feature satisfies a condition in which a value obtained by multiplying the first contribution function by a constant c and subtracting the result of multiplication from the second contribution function exceeds the predetermined threshold value T on the entire domain of the mask according to the equation:

$$h_2(\xi-x) - c \cdot h_1(\xi-x) \geq T,$$

where $h_1(\xi-x)$ is the first contribution function and $h_2(\xi-x)$ is the second contribution function.

18. The storage device of claim 17, wherein a value of the constant c is one.

19. The storage device of claim 17, wherein the predetermined threshold value T is zero.

20. The storage device of claim 13, further comprising a fourth operation of reducing the size of the assist feature after the third operation if a side lobe phenomenon occurs in which the assist feature is printed on a semiconductor wafer.

21. The storage device of claim 13, further comprising a fifth operation programmed to apply optical proximity correction (OPC) to the main feature after the third operation in order to implement a predetermined critical dimension.

22. The storage device of claim 13, further comprising a sixth operation programmed to use a mask rule check after the third operation in order to enhance the performance of the mask.

23. A mask comprising:
   a main feature; and
   an assist feature located at a position satisfying a condition in which a linear combination of a first contribution function for contribution of the assist feature to image intensity at the main feature at a first focus position and a second contribution function for contribution of the assist feature to the image intensity at the main feature at a second focus position exceeds a predetermined threshold value,
   wherein the first contribution function and the second contribution function are functions h(ξ−x) determined by:

$$\frac{I(x) - I_0(x)}{2\sqrt{I_0(x)}} = h(\xi - x)m(\xi)\Delta\xi,$$

where x indicates a point on the main feature, ξ indicates a point on the assist feature, I(x) indicates image intensity at the main feature when the assist feature is present, $I_0(x)$ indicates image intensity at the main feature when the assist feature is not present, and m(ξ) indicates transmittance of a mask.

24. The mask of claim 23, further comprising a plurality of mask features and a plurality of assist features located at locations determined by the linear combination of contribution functions for the assist features and the first and second focus positions to effect enhancement of the depth of focus (DOF), wherein the function h(ξ−x) is obtained respectively for all points on the main feature on the entire domain of the mask.

25. The mask of claim 24, wherein the second focus position is more defocused than the first focus position.

26. The mask of claim 25, wherein the first focus position is an optimal focus position.

27. The mask of claim 26, wherein the determined position of the assist feature satisfies a condition in which a value obtained by multiplying the first contribution function by a constant c and subtracting the result of multiplication from the second contribution function exceeds the predetermined threshold value T on the entire domain of the mask according to the equation:

$$h_2(\xi-x) - c \cdot h_1(\xi-x) \geq T,$$

where $h_1(\xi-x)$ is the first contribution function and $h_2(\xi-x)$ is the second contribution function.

28. The mask of claim 27, wherein a value of the constant c is equal to one.

29. The mask of claim 27, wherein the predetermined threshold value T is zero.

30. The mask of claim 23, wherein the OPC has been applied to the main feature in order to implement a predetermined critical dimension.

* * * * *